United States Patent [19]

Latos et al.

[11] Patent Number: 5,055,722

[45] Date of Patent: Oct. 8, 1991

[54] GATE DRIVE FOR INSULATED GATE DEVICE

[75] Inventors: Thomas S. Latos, Huntley; Kevin L. Wingate, Rockford, both of Ill.

[73] Assignee: Sundstrand Corporation, Rockford, Ill.

[21] Appl. No.: 453,756

[22] Filed: Dec. 20, 1989

[51] Int. Cl.[5] .................. H03K 17/16; H03K 3/013; H03K 19/003; H03K 17/687

[52] U.S. Cl. ........................... 307/570; 307/571; 307/572; 307/542; 307/270

[58] Field of Search ............... 307/443, 542, 572–574, 307/578, 482, 270, 268, 446, 570

[56] References Cited

U.S. PATENT DOCUMENTS

| | | | |
|---|---|---|---|
| 4,220,987 | 9/1980 | Rao et al. | 363/21 |
| 4,296,340 | 10/1981 | Horan | 307/550 |
| 4,423,341 | 12/1983 | Shelly | 307/570 |
| 4,455,526 | 6/1984 | Miller | 323/282 |
| 4,500,801 | 2/1985 | Janutka | 307/570 |
| 4,625,271 | 11/1986 | Chetty et al. | 363/49 |
| 4,651,271 | 3/1987 | Grace | 363/98 |
| 4,721,869 | 1/1988 | Okado | 307/570 |
| 4,801,822 | 1/1989 | Idaka et al. | 307/311 |
| 4,866,313 | 9/1989 | Tabata et al. | 307/270 |
| 4,899,065 | 2/1990 | Nakamura | 307/270 |
| 4,947,063 | 8/1990 | O'Shaughnessy et al. | 307/270 X |
| 4,967,101 | 10/1990 | Nakamura et al. | 307/270 |
| 4,970,420 | 11/1990 | Billings | 307/270 X |
| 4,970,635 | 11/1990 | Shekhawat et al. | 307/270 X |
| 4,982,315 | 1/1991 | Hoffman | 307/270 X |

Primary Examiner—Stanley D. Miller
Assistant Examiner—David R. Bertelson
Attorney, Agent, or Firm—Marshall, O'Toole, Gerstein, Murray & Bicknell

[57] ABSTRACT

A circuit providing improved noise immunity for a first transistor including power terminals and a gate, the power terminals being connected to a power supply and to a load, and the gate being connected to receive control pulses from a pulse source for turning the first transistor on and off. A second transistor has power terminals connected across the gate and one power terminal of the first transistor, and a gate connected to a varying voltage circuit. This varying voltage circuit provides a voltage on the gate of the second transistor which varies in proportion to the spacing between the control pulses and turns on the second transistor when the spacing is greater than a preset value. The pulse source charges the varying voltage circuit during normal operation and the charge turns off the second transistor. During inactivity of the pulse source for a preset time period, the varying voltage circuit changes to the level where the second transistor turns on and shunts the first transistor, thereby preventing the first transistor from being turned on by noise signals.

14 Claims, 1 Drawing Sheet

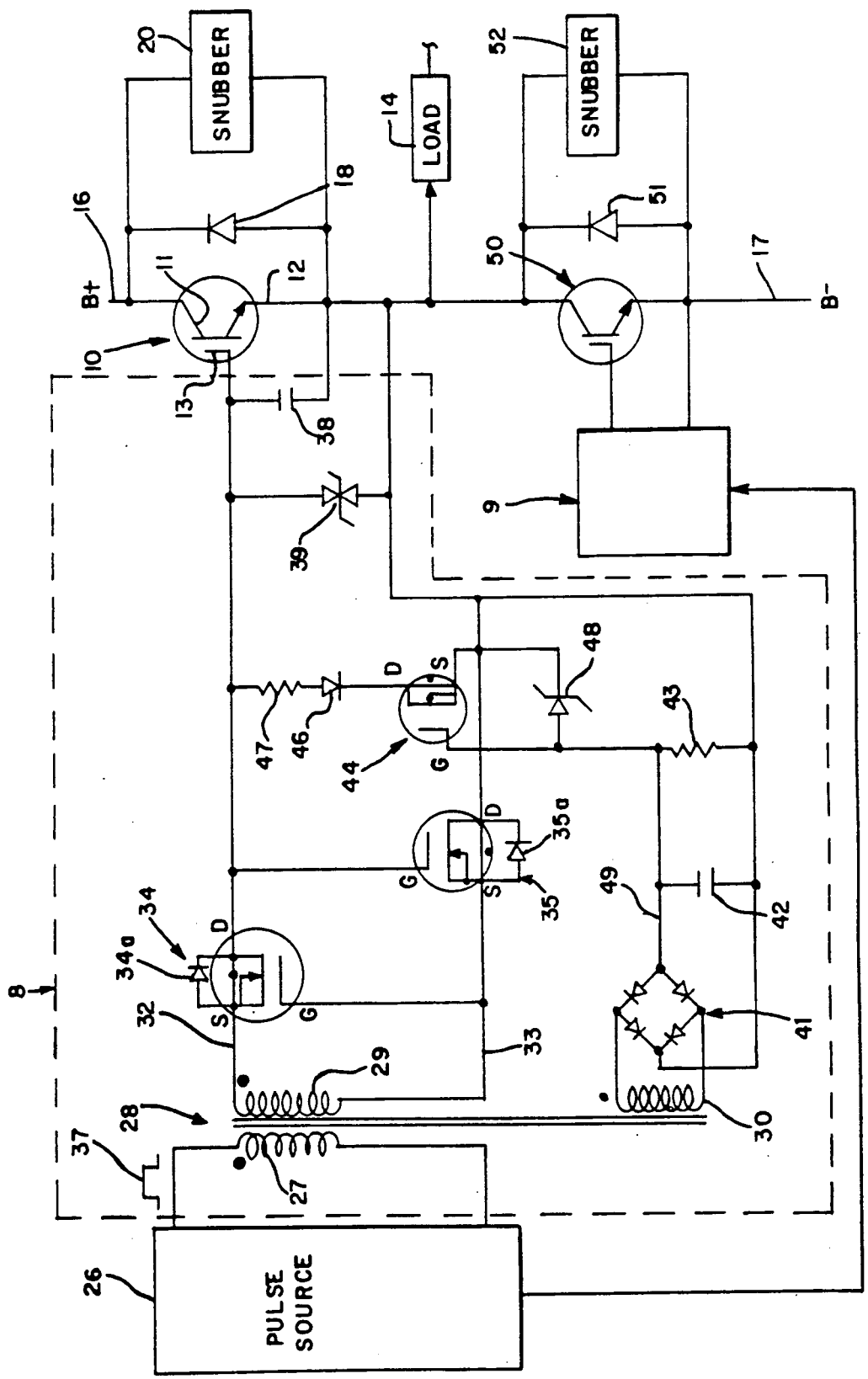

GATE DRIVE FOR INSULATED GATE DEVICE

FIELD AND BACKGROUND OF THE INVENTION

This invention relates to a drive circuit for an insulated gate type of transistor, which is operable to increase the noise immunity of the transistor.

There are numerous designs of power circuits wherein a transistor is turned on and off and thereby controls the current flow to a load. For example, one type of DC to AC inverter includes a number of switch blocks or modules, each including an insulated gate transistor which is switched on and off by control signal pulses.

A problem encountered with a circuit of the above character arises from the fact that high voltage noise is frequently present on the DC power bus, due, for example, to switching transients. During power up and when the power transistor is turned off for an extended period of time, there is a danger that a high voltage noise signal on the bus may turn on the power transistor and disrupt the circuit and the components.

Circuits have been provided in the prior art for protecting transistors from noise problems. For example, the D.F. Horan U.S. Pat. No. 4,296,340 shows a noise protection circuit for a MOSFET transistor, wherein depletion mode transistors shunt the gates of MOSFET transistors to ground during circuit power up conditions. The Horan circuit does not, however, provide protection from noise when no control signals appear at the gate of the MOSFET transistor for a given time period.

In addition to the above Horan patent, the circuits shown in the following U.S. patents are also known but are not believed to be more pertinent than the Horan patent:

Y Idaka et al. U.S. Pat. No. 4,801,822 W.J. Janutka U.S. Pat. No. 4,500,801

P.R.K. Chetty et al U.S. Pat. No. 4,625,271. R.D.W. Shelly U.S. Pat. No. 4,423,341;

C Okado U.S. Pat. No. 4,721,869; A.G.V. Grace U.S. Pat. No. 4,651,271

D.G. Miller U.S. Pat. No. 4,455,526;, T.N. Rao et al. U.S. Pat. No. 4,220,987.

It is a general object of the present invention to provide an improved circuit for providing noise immunity.

SUMMARY OF THE INVENTION

A circuit in accordance with the invention provides improved noise immunity for a first transistor including power terminals and a gate, the power terminals being connected to a power supply and to a load, and the gate being connected to receive control pulses from a pulse source for turning the first transistor on and off. A second transistor has power terminals connected across the gate and one power terminal of the first transistor, and a gate connected to a varying voltage circuit. This varying voltage circuit provides a voltage on the gate of the second transistor which varies in proportion to the spacing between the control pulses and turns on the second transistor when the spacing is greater than a preset value. The pulse source charges the varying voltage circuit during normal operation and the charge turns off the second transistor. During inactivity of the pulse source for a preset time period, the varying voltage circuit changes to the level where the second transistor turns on and shunts the first transistor, thereby preventing the first transistor from being turned on by noise signals.

BRIEF DESCRIPTION OF THE DRAWING

The invention will be better understood from the following detailed description taken in conjunction with the accompanying single figure of the drawing, which is a schematic diagram of a transistor drive circuit in accordance with this invention.

DETAILED DESCRIPTION OF THE DRAWING

The drawing shows two transistor drive circuits 8 and 9 which are identical, and only the circuit 8 is described in detail. The circuit 8 is connected to a power transistor 10 which is an insulated gate type of power transistor, including collector and emitter terminals 11 and 12 and a gate 13. The emitter terminal 12 is connected to a load 14, and the collector 11 is connected to a positive load bus 16. The transistor 10 forms part of an inverter, e.g., with transistor 50 and its transistor drive circuit 9. Connected across the terminals 11 and 12 is a free wheel diode 18 and in a similar manner, diode 51 is connected across transistor 50. A conventional snubber circuit 20 is preferably also connected across the terminals 11 and 12, and snubber circuit 52 is connected across transistor 50 respectively. The emitter of the transistor 50 is connected to a negative load bus 17.

The gate 13 of the transistor 10 receives control pulses (one of which is indicated by the numeral 37) from the circuit 8 and an AC coupled pulse source 26 which may have a conventional design. For example, the pulse source 26 may form part of a pulse width modulator (PWM) circuit. The output of the source 26 is connected across the primary winding 27 of a saturating transformer 28 which has two secondary windings 29 and 30. The secondary winding 29 is connected across upper and lower conductors 32 and 33. A MOSFET 34 has its drain and source connected in the conductor 32, and another MOSFET 35 has its drain and source connected in the conductor 33. The drain of the MOSFET 34 is connected to the gate 13 of the transistor 10, and the drain of the MOSFET 35 is connected to the emitter terminal 12 of the drive transistor 10. The sources of the two MOSFETS 34 and 35 are connected across the winding 29. The gate of the MOSFET 34 is connected to the conductor 33 and the gate of the MOSFET 35 is connected to the other conductor 32.

When the pulse source 26 supplies a square wave pulse 37, the leading or rising edge of the pulse 37 produces a positive going sharp pulse on the upper conductor 32. This positive pulse results in current flow through the body diode 34a of MOSFET 34 to the gate 13 of the transistor 10, and charges the gate capacitance and a capacitor 38 connected in parallel with it and turns the transistor 10 on. The positive voltage on the conductor 32 also appears on the gate of the MOSFET 35 and turns it on, thereby providing for a return current flow path from the emitter of transistor 10 through the lower conductor 33. After time t which is much shorter than the time duration of the pulse 37, transformer 28 saturates, causing the voltage between terminals 32 and 29 to collapse to zero. When this occurs, FET 35 is turned off and the gate capacitance of transistor 10 and the parallel capacitor 38 retain their charge, thus keeping transistor 10 in conduction. At the falling or trailing edge of the pulse 37, transformer 28 unsaturates and a negative going pulse appears on the conductor 33 and current flows in the opposite direction through the body diode 35a of the MOSFET 35 and discharges the gate 13 capacitance and the capacitor 38, thereby turning off the transistor 10. This negative voltage also appears on the gate of the MOSFET 34 and turns it on, thereby providing for a return current flow path through the upper conductor 32.

In a similar manner, after time t second after the occurrence of the falling edge of pulse 37, transformer 28 again saturates, thus retaining the negative charge on the gate of transistor 10 and the parallel capacitor 38, thus keeping transistor 10 off.

When the gate capacitance of the transistor 10 is charged, as described above, the transistor 10 is turned on and current flows from the positive bus 16 to the load 14. The gate capacitance of the transistor 10 is discharged at the trailing edge of the pulse 37, and the transistor 10 is turned off. As the gate 13 of the transistor 10 is switched between positive and negative voltages, a bidirectional voltage clamp 39 connected in parallel with the gate capacitance prevents the voltage from exceeding a maximum positive or negative voltage.

As previously mentioned, the transformer 28 has another secondary winding 30 which is connected across the input of a full wave rectifier bridge 41. The output connections of the bridge 41 are connected across a varying voltage or RC integrator circuit including a capacitor 42 and a resistor 43 which are connected in parallel across the bridge output. The resistor 43 is connected across the gate-source terminals of a depletion mode FET 44. The source of the FET 44 is also connected to the emitter of the transistor 10 and the drain is connected through a diode 46 and a resistor 47 to the base of the transistor 13. A Zener diode 48 is connected in parallel with the gate-source terminals of the FET 44 to limit the voltage.

The leading and trailing edges of each pulse 37 results in negative going pulses on a conductor 49 at the output of the diode bridge 41. Each negative pulse on the conductor 49 charges the capacitor 42 and the charge appears on the gate of the FET 44, this negative charge turning off the FET 44. The capacitor 42 discharges through the resistor 43 between negative pulses, and the time constant of the RC circuit is set, relative to the length of and the spacing between the pulses 37, such that in normal operation a charge continuously appears on the capacitor 42 which is sufficient to continuously turn off the FET 44. However, if during a period of inactivity the length of time between adjacent pulses 37 is greater than a preset value, the capacitor 42 discharges to the point where the voltage on the gate of the FET 44 increases and turns on the FET 44. When this happens, the FET 44 forms a shunt across the gate 13 and the emitter 12 of the drive transistor 10, and the transistor 10 is thus prevented from being turned on due to a noise pulse appearing on the power bus 16–17 connected across the transistor 10.

Thus, the circuit provides noise immunity for the transistor 10 during different phases of operation. When the drive transistor 10 is turned off by a negative pulse from the pulse source 26, a negative voltage on the gate 13 holds the transistor 10 off and prevents the transmission of any noise. During a period of inactivity, the RC circuit discharges and the FET 44 is turned on, thereby forming a shunt across the gate-emitter terminals of the transistor 10 which blocks noise signals. Further, during power-up operation, the FET 44 is on because no pulses have appeared across the transformer 28, the capacitor 42 is not charged, and thus the FET 44 is turned on and also forms a shunt across the transistor 10 during power-up.

The following is a specific example of operating voltages and the values of some components, but it should, of course, be understood that the invention is not limited to operation with these values. In this specific example, the high voltage bus 16 is at 270 volts DC. The gate of the transistor 10 is charged to +15 volts DC when it is on and to −15 volts DC when it is off. The bidirectional voltage clamp 39 prevents the voltage across the transistor 10 from exceeding +15 or −15 volts. The conductor 49 connected to the output of the bridge rectifier 41 is at a voltage of −15 volts DC when a pulse appears across the secondary winding 30, and the Zener diode 48 prevents the voltage from exceeding −15 volts. At the negative voltage of −15 volts DC on the conductor 49, the FET 44 is turned off as previously mentioned; if the capacitor 42 discharges through the resistor 43 and reaches a value of approximately −2 volts DC, the FET 44 is turned on. In normal operation, the capacitor 42 is continuously charged to a value lower than −2 volts DC and the FET 44 is turned off. The FET 44 is turned on only at voltages higher than approximately −2 volts DC.

In this specific example, the capacitor 42 has a value of 0.0047 $\mu$F.; the resistor 43 has a value of 47 K ohms; the resistor 47 has a value of 10 ohms; and the capacitor 38 has a value of 0.0068 $\mu$F.

It will be apparent from the foregoing that a novel and useful circuit has been provided for preventing noise on the high voltage bus from turning on a drive transistor. The depletion mode FET 44 is on and forms a shunt across the gate of an insulated gate transistor during power-up and is turned on when the circuit is in a state of inactivity for greater than a preset period of time (the time being preset by the time constant of the capacitor 42 and the resistor 43). The FET 44 is turned on when the capacitor 42 charge decays to the turn-on value, and the time constant is set to be longer than the length of the pulse 37 and longer than the normal spacing between adjacent pulses; when the FET 44 is turned off it does not affect the normal operation of the drive circuit. When the FET 44 is turned on and shunts the gate-emitter of the transistor 10, there are approximately 15 ohms resistance across the gate-emitter of transistor 10, this resistance being formed by the combination of the 10 ohm resistor 47 and the 5 ohm resistance of the drain-source circuit of the FET 44; as a consequence, no matter how much noise appears across the transistor 10 it will not turn on.

What is claimed is:

1. A circuit for improving the noise immunity of an insulated gate transistor having a base, collector and emitter terminals, the base being connected during operation to a source of control pulses, said pulses having spaces therebetween, comprising:
   a) depletion mode transistor means having a gate, source and drain terminals said drain and source terminals being connected across said gate and said emitter terminals of said insulated gate transistor; and
   b) varying voltage means connected to said gate of said depletion mode transistor means and during operation receiving said control pulses from said source, said control pulses charging said varying voltage means during each of said pulses and during the spacings between said pulses.

2. A circuit as set forth in claim 1, wherein said varying voltage means comprises an RC integrator circuit having a time constant which holds the voltage during said spacings between said pulses.

3. A circuit as set forth in claim 1, and further including a diode connected in series with said drain and source terminals of said depletion mode transistor.

4. A circuit having improved noise immunity, comprising:
   a) a first transistor having a base and two terminals, said power terminals being connected during operation to a power source and said base receiving having spaces therebetween;
   b) a second transistor having a gate and two terminals, said two terminals of said second transistor being connected across said gate and one of said terminals of said first transistor; and
   c) A varying voltage circuit responsive to said control pulses and connected to said gate of said second transistor, said circuit forming a voltage on said gate of said second transistor which varies in proportion to the spacing between said control pulses and turns off said second transistor during the spaces between said control pulses and turns on said second transistor when said spacing is greater than a preset value.

5. A circuit having improved noise immunity, comprising:
   a) a first transistor having a gate and two terminals, said power terminals being adapted to be connected to a power source and said gate being adapted to receive a train of control signals;
   b) a second transistor having a gate and two terminals, said two terminals of said second transistor being connected across said gate and one of said terminals of said first transistor; and
   c) A varying voltage circuit responsive to said control pulses and connected to said gate of said second transistor, said circuit forming a voltage on said gate of said second transistor which varies in proportion to the spacing between said control signals and turns on said second transistor when said spacing is greater than a preset value, said first transistor being an insulated gate transistor.

6. A circuit as set forth in claim 5, and further including a capacitor connected across said gate and said one terminal of said first transistor.

7. A circuit as set forth in claim 4, wherein said second transistor is a depletion mode transistor which has its drain and source terminals connected across said gate and said one terminal of said first transistor.

8. A circuit as set forth in claim 7, and further including a diode connected in series with said drain and source terminals of said second transistor.

9. A circuit as set forth in claim 4, wherein said varying voltage circuit comprises an RC integrator circuit.

10. A circuit as set forth in claim 9, wherein said control signals form a series of pulses, and said varying voltage circuit further includes a full wave rectifier connected too said integrator circuit and receiving said control pulses.

11. A circuit having improved noise immunity comprising:
   a) an insulated gate transistor having a base and collector and emitter terminals, said collector and emitter terminals being connected during operation to a power source and to a load, and said gate being connected to a source of control signals;
   b) a depletion mode second transistor having a gate and source and drain terminals, said drain and source terminals being connected across said base and said emitter terminal of said first transistor; and
   c) an integrator circuit having an input and a varying voltage output, said output being connected to said gate of said second transistor and said input being connected to said source of control signals.

12. A circuit as set forth in claim 11, and further including a transformer having a primary, first secondary winding and second secondary winding, said primary winding receiving a train of square wave pulses, said first secondary winding being connected to said gate and said emitter terminal of said first transistor, and said second secondary winding being connected to a full wave rectifier which is further connected to said integrator circuit.

13. A circuit as set forth in claim 11, and further including a diode connected in series with said drain and source terminals of said second transistor.

14. A circuit as set forth in claim 12, wherein said first secondary winding is connected to said first transistors by first and second conductors, and further comprising third and fourth transistors each having two power terminals and a gate, said two power terminals of said third transistor being connected in said first conductor and said gate of said third transistor being connected to said second conductor, and said two power terminals of said fourth transistor being connected in said second conductor and said gate of said fourth transistor being connected to said first conductor.

* * * * *

REEXAMINATION CERTIFICATE (1867th)
United States Patent [19]

Latos et al.

[11] B1 5,055,722

[45] Certificate Issued Dec. 1, 1992

[54] GATE DRIVE FOR INSULATED GATE DEVICE

[75] Inventors: Thomas S. Latos, Huntley; Kevin L. Wingate, Rockford, both of Ill.

[73] Assignee: Sundstrand Corporation, Rockford, Ill.

Reexamination Request:
No. 90/002,604, Feb. 10, 1992

Reexamination Certificate for:
Patent No.: 5,055,722
Issued: Oct. 8, 1991
Appl. No.: 453,756
Filed: Dec. 20, 1989

[51] Int. Cl.⁵ .............. H03K 17/16; H03K 3/013; H03K 19/003; H03K 17/687
[52] U.S. Cl. .............. 307/570; 307/270; 307/542; 307/571; 307/572
[58] Field of Search ............. 307/570, 571, 572, 234, 307/253, 270, 573, 282, 577, 584, 575, 300, 304; 328/120, 111

[56] References Cited
U.S. PATENT DOCUMENTS

| | | | |
|---|---|---|---|
| 4,430,586 | 2/1984 | Hebenstreit | 307/570 |
| 4,434,403 | 2/1984 | Chang | 328/120 |
| 4,461,966 | 7/1984 | Hebenstreit | 307/282 |
| 4,677,324 | 6/1987 | Ronan, Jr. et al. | 307/300 |
| 4,748,351 | 5/1988 | Barzegar | 307/571 |

*Primary Examiner*—Timothy P. Callahan

[57] ABSTRACT

A circuit providing improved noise immunity for a first transistor including power terminals and a gate, the power terminals being connected to a power supply and to a load, and the gate being connected to receive control pulses from a pulse source for turning the first transistor on and off. A second transistor has power terminals connected across the gate and one power terminal of the first transistor, and a gate connected to a varying voltage circuit. This varying voltage circuit provides a voltage on the gate of the second transistor which varies in proportion to the spacing between the control pulses and turns on the second transistor when the spacing is greater than a preset value. The pulse source charges the varying voltage circuit during normal operation and the charge turns off the second transistor. During inactivity of the pulse source for a preset time period, the varying voltage circuit changes to the level where the second transistor turns on and shunts the first transistor, thereby preventing the first transistor from being turned on by noise signals.

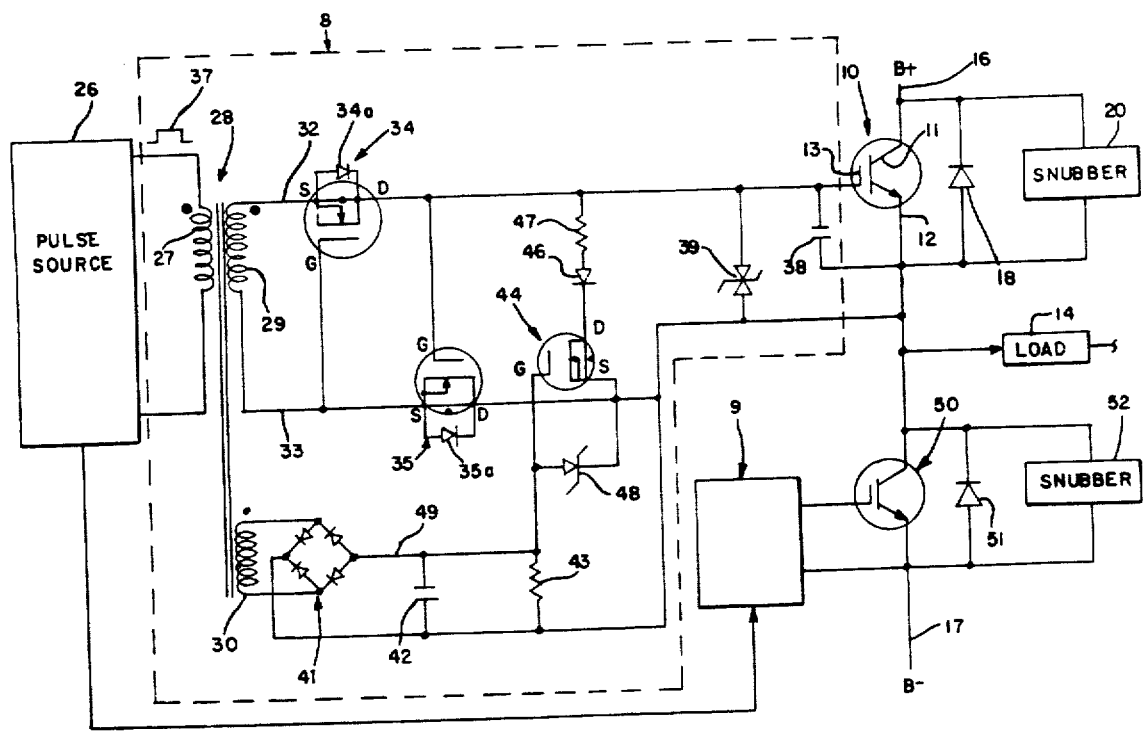

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 2, line 49–Column 3, line 7:

When the pulse source 26 supplies a square wave pulse 37, the leading or rising edge of the pulse 37 produces a positive going sharp pulse on the upper conductor 32. This positive pulse results in current flow through the body diode 34a of MOSFET 34 to the gate 13 of the transistor 10, and charges the gate capacitance and a capacitor 38 connected in parallel with it and turns the transistor 10 on. The positive voltage on the conductor 32 also appears on the gate of the MOSFET 35 and turns it on, thereby providing for a return current flow path from the emitter of transistor 10 through the lower conductor 33. After time t which is much shorter than the time duration of the pulse 37, transformer 28 saturates, causing the voltage between [terminals 32 and 29] *conductors 32 and 33* to collapse to zero. When this occurs, FET 35 is turned off and the gate capacitance of transistor 10 and the parallel capacitor 38 retain their charge, thus keeping transistor 10 in conduction. At the falling or trailing edge of the pulse 37, transformer 28 unsaturates and a negative going pulse appears on the conductor 33 and current flows in the opposite direction through the body diode 35a of the MOSFET 35 and discharges the gate 13 capacitance and the capacitor 38, thereby turning off the transistor 10. This negative voltage also appears on the gate of the MOSFET 34 and turns it on, thereby providing for a return current flow path through the upper conductor 32.

Column 3, lines 24–37:

As previously mentioned, the transformer 28 has another secondary winding 30 which is connected across the input of a full wave rectifier bridge 41. The output connections of the bridge 41 are connected across a varying voltage or RC integrator circuit including a capacitor 42 and a resistor 43 which are connected in parallel across the bridge output. The resistor 43 is connected [across the gate-source terminals] *to the gate* of a depletion mode FET 44. The source of the FET 44 is also connected to the emitter of the transistor 10 and the drain is connected through a diode 46 and a resistor 47 to the base of the transistor 13. A Zener diode 48 is connected in parallel with the gate-source terminals of the FET 44 to limit the voltage.

AS A RESULT OF REEXAMINATION, IT HAS BEEN DETERMINED THAT:

Claims 1, 4, 5, 10, 11 and 14 are determined to be patentable as amended.

Claims 2, 3, 6–9, 12 and 13, dependent on an amended claim, are determined to be patentable.

1. A circuit for improving the noise immunity of an insulated gate transistor having a [base] *gate*, collector and emitter terminals, the [base] *gate* being connected during operation to a source of control pulses, said pulses having spaces therebetween, comprising:
   a) depletion mode transistor means having a gate, source and drain terminals, said drain and source terminals being connected across said gate and said emitter terminals of said insulated gate transistor; and
   b) varying voltage means connected to said gate of said depletion mode transistor means and during operation receiving said control pulses from said source, said control pulses charging said varying voltage means during each of said pulses and during the spacings between said pulses.

4. A circuit having improved noise immunity, comprising:
   a) a first transistor having a [base] *gate* and two *power* terminals, said power terminals being connected during operation to a power source and said [base] *gate* receiving *a train of control pulses* having spaces therebetween;
   b) a second transistor having a gate and two terminals, said two terminals of said second transistor being connected across said gate and one of said terminals of said first transistor; and
   c) [A] *a* varying voltage circuit responsive to said control pulses and connected to said gate of said second transistor, said circuit [forming] *including charge storage means which forms* a voltage on said gate of said second transistor which varies in proportion to the spacing between said control pulses and turns off said second transistor during the spaces between said control pulses and turns on said second transistor when said spacing is greater than a preset value.

5. A circuit having improved noise immunity, comprising:
   a) a first transistor having a gate and two terminals, said power terminals being adapted to be connected to a power source and said gate being adapted to receive a train of control *pulses* signals having spaces therebetween;
   b) a second transistor having a gate and two terminals, said two terminals of said second transistor being connected across said gate and one of said terminals of said first transistor; and
   c) [A] *a* varying voltage circuit responsive to said control [pulses] *signals* and connected to said gate of said second transistor, said circuit [forming] *including charge storage means which forms* a voltage on said gate of said second transistor which varies in proportion to the spacing between said control signals and turns on said second transistor when said spacing is greater than a preset value, said first transistor being an insulated gate transistor.

10. A circuit as set forth in claim 9, wherein said control signals form a series of pulses, and said varying voltage circuit further includes a full wave rectifier connected [too] *to* said integrator circuit and receiving said control pulses.

11. A circuit having improved noise immunity, comprising:
 a) an insulated gate transistor having a [base] *gate* and collector and emitter terminals, said collector and emitter terminals being connected during operation to a power source and to a load, and said gate being connected to a source of control signals;
 b) a depletion mode second transistor having a gate and source and drain terminals, said drain and source terminals being connected across said [base] *gate* and said emitter terminal of said first transistor; and
 c) an integrator circuit having an input and a varying voltage output, said output being connected to said gate of said second transistor and said input being connected to said source of control signals.

14. A circuit as set forth in claim 12, wherein said first secondary winding is connected to said first [transistors] *transistor* by first and second conductors, and further comprising third and fourth transistors each having two power terminals and a gate, said two power terminals of said third transistor being connected in said first conductor and said gate of said third transistor being connected to said second conductor, and said two power terminals of said fourth transistor being connected in said second conductor and said gate of said fourth transistor being connected to said first conductor.

* * * * *